United States Patent
Tsujioka (10) Patent No.: US 6,847,541 B2
(45) Date of Patent: Jan. 25, 2005

(54) INFORMATION STORAGE DEVICE, AND INFORMATION STORAGE METHOD AND INFORMATION REGENERATION METHOD EMPLOYING THE INFORMATION STORAGE DEVICE

(75) Inventor: Tsuyoshi Tsujioka, Osaka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 57 days.

(21) Appl. No.: 10/454,505

(22) Filed: Jun. 5, 2003

(65) Prior Publication Data

US 2003/0227793 A1 Dec. 11, 2003

(30) Foreign Application Priority Data

Jun. 7, 2002 (JP) .................................... 2002-167375

(51) Int. Cl.[7] .............................................. G11C 13/00
(52) U.S. Cl. ...................................... 365/151; 365/153
(58) Field of Search ................................ 365/151, 153, 365/163

(56) References Cited

U.S. PATENT DOCUMENTS 6,198,655 B1 * 3/2001 Heath et al. ................ 365/151
6,556,470 B1 * 4/2003 Vincent et al. .............. 365/151

OTHER PUBLICATIONS

Extended Abstracts (The 50th Spring Meeting, 2003); The Japan Society of Applied Physics and Related Societies, no. 3, pp. 100 and 1346, Mar. 27, 2003 (with English translation).

Y-K. Choi, et al., International Electron Devices Meeting, pp. 421–424, "SUB–20nm CMOS FinFET Technologies", 2001.

Optical Materials Handbook (New Edition), pp. 494–510 (with partial English translation).

* cited by examiner

Primary Examiner—Son T. Dinh
(74) Attorney, Agent, or Firm—Oblon, Spivak, McClelland, Maier & Neustadt, P.C.

(57) ABSTRACT

An information storage device which has a layer containing such bistable molecules that the molecular structure reversibly changes due to an isomerization reaction, at least one reaction of the isomerization reaction is caused by electric carrier injection, and the electric characteristics change as between before and after the isomerization reaction.

10 Claims, 3 Drawing Sheets

Fig. 1

Fig. 2(a)
CLOSED-RING FORM

HOLE INJECTION

Fig. 2(b)
OPEN-RING FORM

INFORMATION STORAGE DEVICE, AND INFORMATION STORAGE METHOD AND INFORMATION REGENERATION METHOD EMPLOYING THE INFORMATION STORAGE DEVICE

BACKGROUND OF THE INVENTION

1. Field of the Invention

The present invention relates to an information storage device, and an information storage and regeneration method employing the information storage device. Particularly, it relates to a novel information storage device employing as an information storage material bistable molecules which undergo an isomerization reaction by electric carrier injection and electric characteristics of which change accompanying the isomerization reaction, and an information storage and regeneration method employing the information storage device.

2. Discussion of Background

In recent years, along with progress in information-related technology, demand for large capacity storage devices for storing information is growing. For information storage devices to be used for computers, (1) high speed recording and regeneration and (2) mass storage property are required, and further as additive performances required, (3) non-volatile properties with which no special electric power is required for holding information and (4) portability of the stored data are required. Particularly, the above performance (1) is important for memory which is closest to and frequently accesses the CPU, i.e. SRAM, DRAM, etc. of e.g. cash memory or main memory located within the CPU. Further, for the program body or for storage of large scale data by the program body, a hard disk drive which is excellent in the above performance (1) to a certain extent and which is excellent in the performances (2) and (3) is employed. Further, for storage of an enormous quantity of data and for distribution of the application soft and animation soft, optical disks particularly excellent in the performances (2), (3) and (4) are employed. Further, in recent years, for music and for digital cameras and mobile telephones, use of non-volatile semiconductor memory (flash memory) is rapidly increasing, as an information storage device which is mechanical less, which is compact and which is excellent in the performances (3) and (4).

For the above DRAM or semiconductor memory such as flash memory, although the above performances (1) or (3) and (4) are important, a need for mass storage (high integration) is also great, and technical development therefor has been actively carried out. The typical technology for high integration of the semiconductor is miniaturization technology, and it is to minify the so-called design rule. For example, Intel Corporation (U.S.A) announced a transistor having a gate length of 15 nm at 2001 International Electron Devices Meeting (2001 IEDM (Dec. 3–5, 2001)), and it is considered that high definition of such miniaturization develops as heretofore in the foreseeable future.

On the other hand, it has been known that development in miniaturization alone is insufficient, considering the above mass storage as a semiconductor memory device. For example, the special feature in NIKKEI ELECTRONICS 2001. 2. 12 (No. 789) p. 152, describes as follows.

Figure 5:
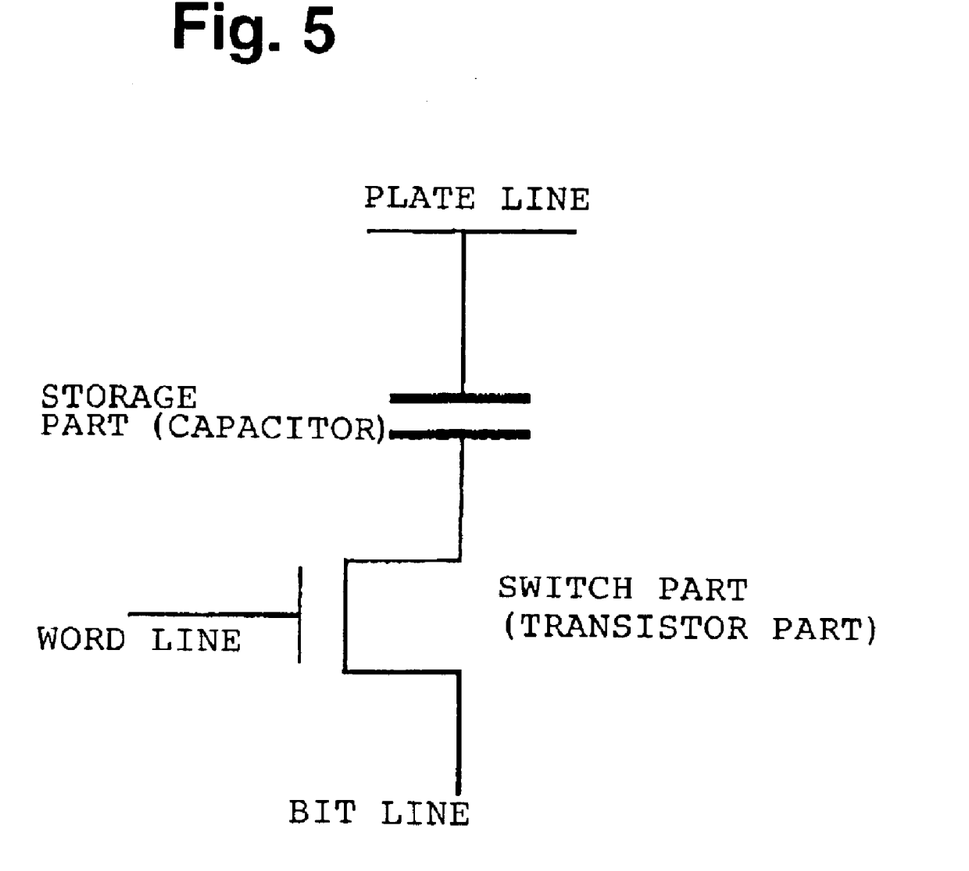
FIG. 5 is a diagram illustrating the circuit structure of a conventional semiconductor memory device (DRAM).

Each cell constituting the memory device comprises a switch part such as a transistor and an information storage part such as a capacitor (in a case of DRAM), as shown in FIG. 5. The switch part may be miniaturized along with development in miniaturization technology, however, the information storage part can not be miniaturized. For example, in the past history of high integration of DRAM, the capacitor part is made to have three dimensions to secure the required stored charge, however, high integration by making the capacitor part have three dimensions reaches the limit. Thus, a memory device of new principle employing no capacitor, such as FeRAM, MRAM or phase change RAM has been proposed. Information is stored in a polarized state of ferroelectric in the case of FeRAM, by the magnetization direction of the magnetic material in the case of MRAM, or by the difference between the crystal state and the amorphous state of the phase change material in the case of phase change RAM, respectively.

However, in the case of such a memory device, it is necessary to handle an aggregate state of a large number of atoms constituting the storage part at the time of storing information, and accordingly storage tends to be difficult from its principle, if the size of the storage part is reduced and the number of the constituting atoms is reduced. Accordingly, difficulty in further high integration with such a memory device is in prospect.

SUMMARY OF THE INVENTION

It is an object of the present invention to provide an information storage device which can constitute a small information storage part sufficiently capable of dealing with further development in miniaturization technology of the switch part in future, with which further high integration is thereby possible, by introducing a novel storage and regeneration principle by employing a novel material system to the information storage part of a conventional memory device, and an information storage and regeneration method employing the information storage device.

The information storage device of the present invention is characterized by having a layer containing such bistable molecules that the molecular structure reversely changes due to an isomerization reaction, at least one reaction of the isomerization reaction is caused by electric carrier injection, and the electric characteristics change as between before and after the isomerization reaction.

In the present invention, the "bistable molecules" mean such a compound that when isomers representing the recorded state and the non-recorded state of information satisfy the following conditions:

(a) each of them is stable at room temperature under normal pressure in environment light, (b) they are mutually and reversibly exchanged with each other by means of an isomerization reaction via the excited state, and (c) the isomerization reaction occurs only when an energy is supplied from the outside.

The room temperature is usually at a level of from 0 to 50° C., the normal pressure is usually at a level of 1 atom, and being stable means that decomposition and other physical/chemical changes will not occur.

The bistable molecules employed in the present invention undergo an isomerization reaction via the excited state by electric carrier injection in the unexcited state, their molecular structure changes and they are formed into an isomer. Accordingly, the molecules before and after the isomerization reaction show stable bistability.

By forming a layer containing such bistable molecules between electrodes in the information storage part as shown in FIG. 5, information storage at the molecular level becomes possible, and it becomes possible to optionally miniaturize the information storage part, ultimately to miniaturize it to the level of one molecule.

Heretofore, as one of compounds of which the molecular structure reversibly changes by irradiation with light and the absorption spectrum and other physical properties change accompanying the reversible change, photochromic molecules have been known. For example, as described in "New Edition Optical Material Handbook" p. 494 (REALIZE INC. published in 2001), the photochromic molecules have been well known as a material for optical memory. For the isomerization reaction of the photochromic molecules, the molecules are required to be in the excited state, and irradiation with light is employed as a means therefor.

The present inventor has found that the means to let the molecules be in the excited state for the isomerization reaction is not limited to irradiation with light (Photon-mode), but electric carrier injection (Electron-mode) may also be employed, and the present invention has been accomplished by applying this discovery to a high density memory device.

Here, the electric characteristics of the bistable molecules which reversibly change are preferably ionization potential. Further, it is preferred that isomers a and b of the bistable molecules before and after the information storage satisfy the formula:

[Ionization potential of the isomer a]>[Ionization potential of the isomer b]

and the ionization potential of the isomer a is higher by at least 0.1 eV than the ionization potential of a layer which performs a function of hole injection.

The bistable molecules are particularly preferably photochromic diheteroarylethenes having an electron transport group and a hole transport group.

The information storage device of the present invention preferably has an information storage part having the bistable molecule-containing layer and a switch part controlling the voltage to be applied to the information storage part.

The information storage method of the present invention is characterized by carrying out electric carrier injection on the layer containing the bistable molecules of the information storage device of the present invention to cause an isomerization reaction on the bistable molecules.

Further, the information regeneration method of the present invention is characterized by applying a voltage to the layer containing the bistable molecules of the information storage device of the present invention and detecting a change in the electric current, i.e. applying a voltage to the information storage part and reading out the information storage state by the difference in the electric conductivity of the carriers.

Further, the information storage and regeneration method of the present invention is characterized by carrying out electric carrier injection on the layer containing the bistable molecules of the information storage device of the present invention to cause an isomerization reaction on the bistable molecules thereby to store information, and by applying a voltage to the layer containing the bistable molecules of the information storage device and detecting a change in the electric current as between before and after the storage to read out information.

The information storage device of the present invention may be constituted by combining an information storage part of an entirely new principle by the bistable molecules with the switch part of a conventional silicon semiconductor memory for example. Such an information storage device of the present invention has the following advantages.

Namely, although there has conventionally been several proposals regarding a memory device employing organic molecules, how to access the molecules for storage and regeneration of information has been problematic. A conventional semiconductor production process can not be applied to the organic molecule layer itself, and a means of e.g. self-assembly may be mentioned as a patterning method for the device, but it is insufficient in various points such as productivity and accuracy of finishing, and can not be used practically.

On the other hand, in the case of the information storage device of the present invention, for the circuit part employed for access to the bistable molecules, an ultramicroscopic pattern formation which became possible by the advance in technology in recent years may be carried out on a silicon substrate for example, in the same manner as a conventional semiconductor production process, whereas for production of the information storage part, microscopic pattern formation is not necessarily carried out. With the bistable molecules employed for the information storage part, information storage as the molecular unit is possible, whereby it is not necessary to compartmentalize adjacent devices by pattern formation. Accordingly, for the information storage device of the present invention, the bistable molecule-containing layer and an electrode layer to be formed thereon may be formed all over and evenly for example, without microscopic patterning.

Namely, in the present invention, merits of the silicon semiconductor production process and characteristics of the bistable molecules are combined, whereby an extremely practical and excellent information storage device which not only makes good use of the characteristics of both but also overcomes the problems of both, can be realized.

BRIEF DESCRIPTION OF THE DRAWINGS

Now, embodiments of the information storage device of the present invention and the information storage method and the information regeneration method employing the information storage device will be explained in detail with reference to the accompanying drawings.

In the present specification, "information storage device" "memory device" and "storage device" are all equivalent.

Figure 1:
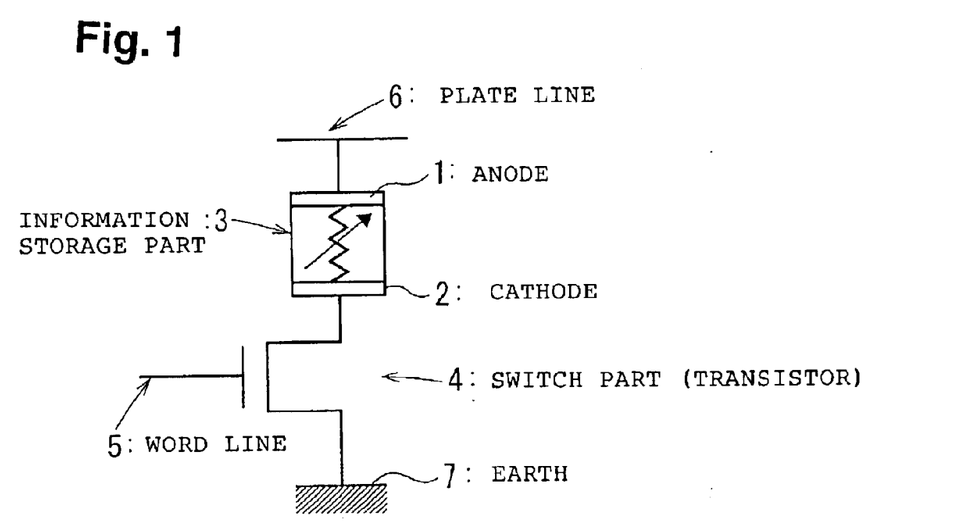
FIG. 1 is a diagram illustrating the circuit structure of the information storage device according to the preferred embodiment.

FIG. 1 is a diagram illustrating the circuit structure of the information storage device according to the preferred embodiment. The information storage device has an information storage part 3 constituted by forming a bistable molecule-containing layer between electrodes in the constitution of a conventional semiconductor memory as shown in FIG. 5. In FIG. 1, numerical reference 1 designates an anode, numerical reference 2 designates a cathode, numerical reference 4 designates a switch part (transistor), numerical reference 5 designates a word line, numerical reference 6 designates a plate line and numerical reference 7 designates an earth.

The circuit constitution of the information storage device of the present invention is by no means restricted to one shown in FIG. 1, and may be applied to various forms of information storage devices, but preferably comprises an information storage part having a bistable molecule-containing layer and a switch part controlling the voltage to be applied to the information storage part.

Further, for the information storage part, practically, it is preferred to form a hole transport layer between the bistable molecule-containing layer and an anode and to form an electron transport layer between a cathode and the bistable molecule-containing layer, with a purpose of increasing the hole and electron injection efficiencies to the bistable molecules in the bistable molecule-containing layer and optimizing the carrier injection balance.

The information storage device of the present invention is characterized by having the bistable molecule-containing layer.

The bistable molecule-containing layer contains such bistable molecules that their molecular structure reversibly changes due to an isomerization reaction, at least one reaction of the isomerization reaction is caused by electric carrier injection, and the electric characteristics change as between before and after the isomerization reaction.

Now, the bistable molecules employed in the present invention will be explained below.

The electric characteristics of the molecules, which change as between before and after the isomerization reaction are not particularly limited, but are preferably ionization potential.

The ionization potential is defined as an energy required to emit electrons in the HOMO (highest occupied molecular orbital) level of a substance to the vacuum level. The ionization potential may be defined directly by photoelectron spectroscopy or may be obtained by calibrating the electrochemically measured oxidation potential relative to the reference electrode also. In the case of the latter method, if a saturated calomel electrode (SCE) is employed as a reference electrode, it is defined as:

Ionization potential=oxidation potential (vs. SCE)+4.3 eV ("Molecular Semiconductors", Springer-Verlag, 1985, p. 98).

The bistable molecules employed in the present invention are by no means restricted to the photochromic diheteroarylethenes as shown in FIG. 2 as described hereinafter, and they are not particularly limited so long as they are bistable molecules of which the molecular structure reversibly changes due to an isomerization reaction and the electric characteristics change accompanying the reversible change, and which undergo an isomerization reaction by electric carrier injection. However, bistable organic molecules are preferred since a bistable molecule-containing layer will easily be formed, and various photochromic molecules are particularly preferred.

The bistable organic molecules employed in the present invention are preferably ones which undergo an isomerization reaction also by irradiation with light as described in the following Example, and such bistable organic molecules will easily recover to the original state by irradiation with light after an isomerization reaction is caused by electric carrier injection.

As a representative example of such molecules, a photochromic compound having both electron transport group and hole transport group may be mentioned. In such a case, the numbers of the electron transport group and the hole transport group contained in one molecule of the photochromic compound are not particularly limited so long as performances of the information storage device of the present invention are not impaired. Their numbers and types may be selected so that appropriate ionization potential and electron affinity will be obtained, taking the balance of electric characteristics of both groups into consideration, but usually one electron transport group and one hole transport group are contained in one compound. The photochromic compound may, for example, be a spiropyran compound, a spirooxazine compound, a fulgide compound, an azobenzene compound or a diheteroarylethene compound, and preferred is a diheteroarylethene compound.

The diheteroarylethene compound is a compound wherein at least one heteroaryl group is bonded to each of two carbon atoms constituting an ethene group, and substituents of the heteroaryl groups undergo an isomerization reaction to form an open-ring form or a closed-ring form.

Specifically, a compound of the following structural formula [0] may be mentioned:

[0]

wherein ring A is any one of the following four structures:

wherein $R^0$ is an alkyl group which may have a substituent, an alkoxy group which may have a substituent or a cyano group, provided that the substituent which each of the alkyl group and the alkoxy group may have is a halogen atom, a cyano group or an alkoxy group, each of $R^{11}$ and $R^{12}$ which are independent of each other, is an alkyl group, a cycloalkyl group or an alkoxy group, each of rings X and Y which are independent of each other, is a 5- or 6-membered monocyclic or two- to three-ring-condensed aromatic heterocyclic group, provided that each of rings X and Y may have a substituent.

The compound of the above formula [0] is substituted with at least one electron transport group and at least one hole transport group.

As the electron transport group, known groups such as may be mentioned, but it is not limited thereto. Further, as the hole transport group, known groups including diarylamino groups and groups analogous thereto, such as may be mentioned, but it is not limited thereto.

In the case where the above electron transport group and hole transport group are bonded to the diheteroarylethene compound, they are bonded preferably to the aryl group moiety. Specifically, a compound of the following formula (I) is particularly preferred:

(I)

(wherein each of $R^1$ and $R^2$ which are independent of each other, is a $C_{1-3}$ alkyl group or an alkoxy group, and each of rings D and E which are independent of each other, is (wherein R is $R^1$ or $R^2$, and R' is $R^3$ or $R^4$), $R^3$ is a diarylamino group which may have a substituent, and $R^4$ is an oxadiazole group substituted with a 4-mercaptobiphenyl group, provided that the 4-mercaptobiphenyl group may further have a substituent).

The bistable organic molecules of the present invention may be in the form of either a low molecular weight compound or a polymer. In the case of a polymer, a polymer containing a partial structure derived from the above-described various photochromic compounds at its side chain or main chain, having a molecular weight at a level of from 1,000 to 100,000 may be mentioned. Further, it may be a polymer containing a partial structure derived from the above-described compound of the formula (0) or the formula (I) at its side chain or main chain. The partial structure derived from the photochromic compound contained in one polymer molecule may be one type or several types so long as the purpose of the present invention is not impaired.

As the bistable organic molecules of the present invention, more preferred is a low molecular weight compound. Its molecular weight varies depending upon the structure or properties of the compound and the method for forming a layer containing the compound, but is usually at a level of from 200 to 2,000, preferably at a level of from 400 to 1,000. A compound having a molecular weight to this extent is also suitable for film formation process by e.g. vacuum deposition as described hereinafter.

Figure 2A:
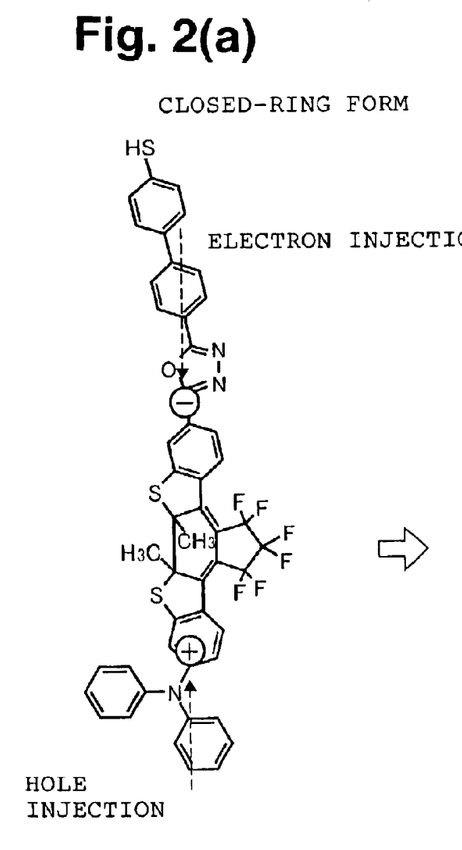
FIGS. 2(a) and 2(b) are drawings illustrating the isomer structure of photochromic diheteroarylethenes suitable as bistable molecules employed in the present invention.
Figure 2B:
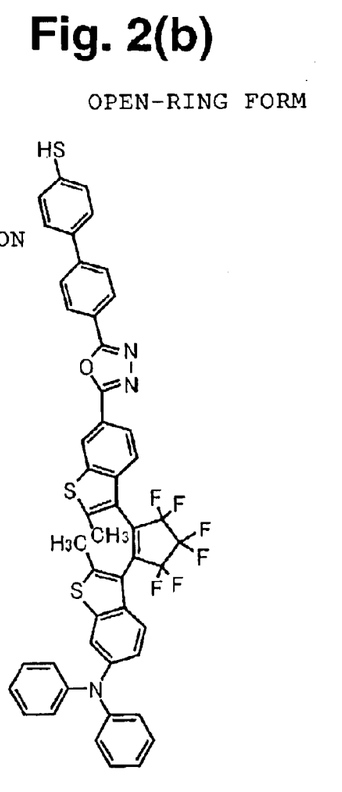

FIGS. 2(a) and 2(b) are drawings illustrating one example of the isomer structure of the photochromic diheteroarylethenes suitable as the bistable molecules employed in the present invention. In this molecule, in addition to the usual diheteroarylethene moiety in charge of the photochromic isomerization reaction, a diphenylamino group for hole transport property and an oxadiazole group for electron transport property are introduced for modification. By such hole transport property modification and electron transport property modification, holes and electrons will be injected to the bistable molecule efficiently, whereby the isomerization reaction can be occurred with a less electric current, thus leading to low electric power consumption.

With respect to the diheteroarylethene molecule, when a voltage is applied to the closed-ring form as shown in FIG. 2(a), and electrons and holes are injected and recombined on the molecule, the molecule is in the excited state and undergoes an isomerization reaction, and is formed into the open-ring form as shown in FIG. 2(b). Of the diheteroarylethene molecule, the ionization potential is 5.8 eV in the closed-ring form, whereas it changes to at least 6.2 eV in the open-ring form. Further, the open-ring form can be recovered to the closed-ring form by irradiating the open-ring form with light to cause the photochromic isomerization reaction. Accordingly, both the closed-ring form and the open-ring form can be present stably.

The bistable molecule-containing layer contained in the information storage part of the present invention contains the above-described bistable molecules, and it may contain a binder resin or a known additive such as an antioxidant, a coating property-improving agent or a plasticizer within a range of not impairing the performances of the information storage device of the present invention. It contains the bistable molecules in an amount of preferably at least 50 wt %, more preferably at least 80 wt %, particularly preferably at least 90 wt %, and it is most preferably a layer consisting essentially of the bistable molecules alone.

The bistable molecule-containing layer may contain two or more types of the above-described bistable molecules. Further, the information storage device of the present invention may contain two or more bistable molecule-containing layers.

Such a layer containing the bistable molecules, preferably bistable organic molecules such as photochromic diheteroarylethenes, can easily be formed in the same manner as the hole transport layer, the electron transport layer, etc., by means of e.g. a known coating method such as vacuum deposition or spin coating.

The thickness of the bistable molecule-containing layer is usually at least 1 nm, preferably at least 5 nm, and usually at most 100 nm, preferably at most 30 nm.

Now, the other layers constituting the information storage device of the present invention will be explained below.

Usually, the anode is formed by using e.g. a metal such as aluminum, gold, silver, nickel, palladium or platinum, a metal oxide such as an oxide of indium and/or tin, a halogenated metal such as copper iodide, carbon black or a conductive polymer such as poly(3-methylthiophene), polypyrrole or polyaniline, on a substrate such as a plate of quartz or glass, a metal plate or a metal foil, or a plastic film or sheet. The thickness of the anode is usually at least 3 nm, preferably at least 5 nm, and usually at most 1,000 nm, preferably at most 500 nm. Particularly preferred as the material of the anode is platinum.

The hole transport layer is formed, for example, by using a triarylamine compound, an aromatic diamine having a styryl structure, a starburst type aromatic triamine, a diaminophenyl phenanthridine derivative, a silazane compound, a silanamine derivative or a phosphamine derivative. The thickness of the hole transport layer is usually at least 5 nm, preferably at least 10 nm, and usually at most 300 nm, preferably at most 100 nm.

The electron transport layer is formed, for example, by using an aluminum complex compound of 8-hydroxyquinoline, a complex compound of 10-hydroxybenzo[h]quinoline, an oxadiazole derivative, a distyrylbiphenyl derivative, a silole derivative, a 3- or 5-hydroxyflavone complex compound, a benzoxazole complex compound, a benzothiazole complex compound, a n-type hydrogenated amorphous silicon carbide, n-type zinc sulfide or n-type zinc selenide. The thickness of the electron transport layer is usually at least 5 nm, preferably at least 10 nm, and usually at most 200 nm, preferably at most 100 nm.

The cathode may be formed, for example, by using silver, a magnesium-silver alloy, a magnesium-indium alloy or an aluminum-lithium alloy, into a thickness at the same level as the anode. In a case where the information storage device of the present invention is a type of carrying out information erasing by irradiation with light, it is necessary that the irradiated light for erasing passes through the cathode and/or anode, e.g. by making the thickness of the metal of the cathode and/or anode thin.

Further, on the cathode, a protective electrode layer comprising a metal electrically conductive film of e.g. copper, nickel, chromium, gold, platinum or ITO may be formed. The thickness of the protective electrode layer is usually at least 3 nm, preferably at least 5 nm, and usually at most 1,000 nm, preferably at most 500 nm.

An anode buffer layer may be formed between the anode and the hole transport layer with a purpose of decreasing the potential barrier for hole injection to the information storage part of the information storage device of the present invention, specifically the bistable molecule-containing layer. The anode buffer layer may be formed by using e.g. a phthalocyanine compound such as copper phthalocyanine, an electrically conductive polymer compound such as polyaniline or polythiophene, a sputter/carbon film, or a metal oxide such as vanadium oxide, ruthenium oxide or molybdenum oxide. The thickness of the anode buffer layer is usually at least 3 nm, preferably at least 5 nm, and usually at most 100 nm, preferably at most 50 nm.

Further, a cathode buffer layer may be formed with a purpose of decreasing the potential barrier for electron injection to the information storage part of the information storage device of the present invention, specifically the bistable molecule-containing layer. The cathode buffer layer may be formed by using e.g. LiF, $MgF_2$ or $Li_2O$. The thickness is preferably very thin, and usually at a level of from 0.1 to 5 nm.

As the materials of the electron transport layer, the hole transport layer, the cathode buffer layer and the anode buffer layer, in addition to the above-described materials, materials used for the similar layer of an organic electric field emission device may optionally be selected.

Each of these layers in the information storage device of the present invention is not required to be microfabricated, and may be formed as an even uniform film. The method of forming each layer may optionally be selected depending upon e.g. the type of the material for layer formation, and is not particularly limited. For example, a wet film formation method including a coating method such as spraying, printing, spin coating, dip coating or die coating, and a printing method such as an ink jet method or screen printing, or a dry film formation method such as vacuum deposition or sputtering may, for example, be mentioned.

In the information storage device of the present invention, the bistable molecule-containing layer for holding the stored information contains such bistable molecules that their molecular structure reversibly changes due to the isomerization reaction, at least one reaction of the isomerization reaction is caused by electric carrier injection, and the electric characteristics change as between before and after the isomerization reaction. The electric characteristics of the molecules, which change as between before and after the isomerization reaction, are not particularly limited, but are preferably ionization potential.

Now, the principle of the information storage and regeneration of the information storage device of the present invention wherein the bistable molecule-containing layer is formed as an information storage part between electrodes will be explained with reference to FIGS. 3, 4(a) and 4(b).

Figure 3:
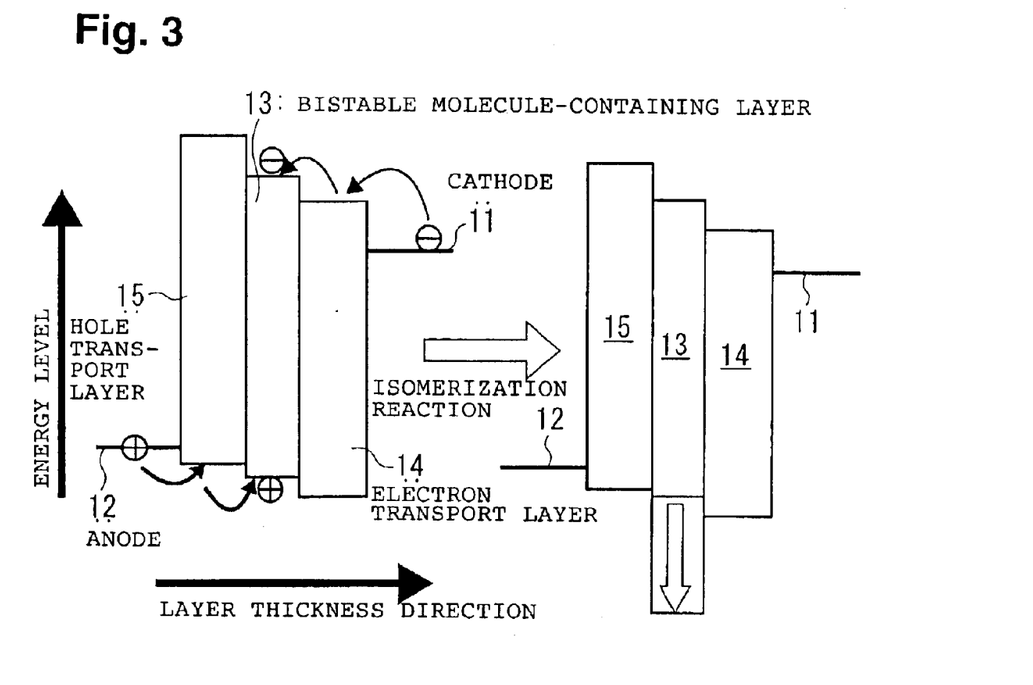
FIG. 3 is a schematic view illustrating one example of the principle of information storage of the information storage device of the present invention.
Figures 4A, 4B:
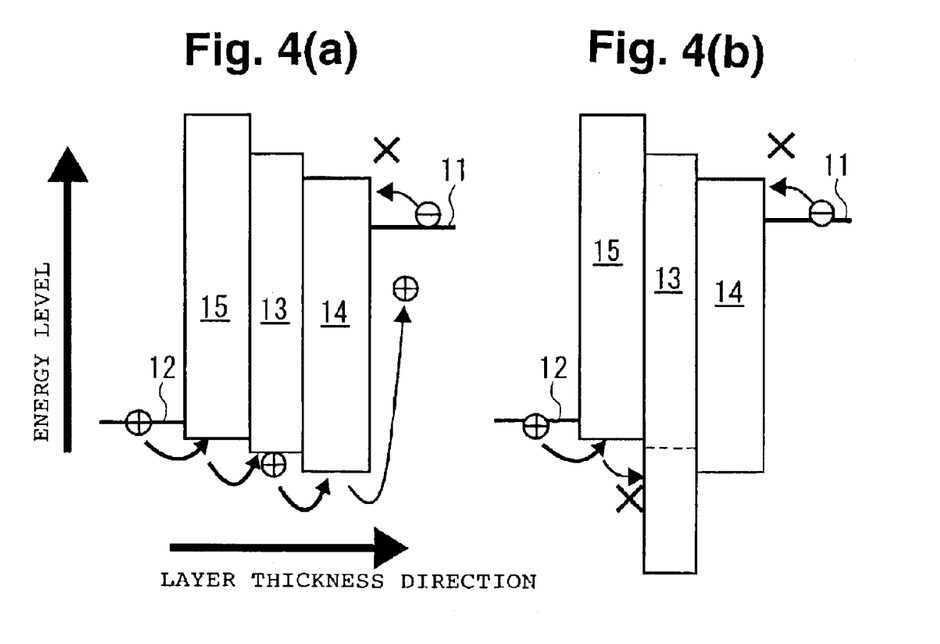
FIGS. 4(a) and 4(b) are schematic views illustrating one example of the principle of information regeneration of the information storage device of the present invention.

In FIGS. 3, 4(a) and 4(b), an electron transport layer 14 is formed between a cathode 11 and a bistable molecule-containing layer 13, and a hole transport layer 15 is formed between an anode 12 and the bistable molecule-containing layer 13. In FIGS. 3, 4(a) and 4(b), the vertical axis represents the energy level of the information storage part comprising the bistable molecule-containing layer 13, the electron transport layer 14 and the hole transport layer 15, formed between the cathode 11 and the anode 12, and the horizontal axis represents the thickness direction of each layer.

The ionization potential level (HOMO level) of each of the organic layers including the electron transport layer 14, the bistable molecule-containing layer 13 and the hole transport layer 15 forms a band which performs a function of hole transport, and the LUMO level of the electron affinity forms a band which performs a function of electron transport. Between the respective organic layers and electrodes, a potential barrier is formed due to the difference in the energy band level.

By applying a relatively high voltage to the information storage part of such an information storage device, as shown in FIG. 3, holes and electrons are injected from the anode 12 and the cathode 11, respectively, and they are recombined on the molecule of the bistable molecule-containing layer 13 to make the molecule be in the excited state. As a result, the molecule undergoes an isomerization reaction, and electronic physical properties of the molecule such as ionization potential or carrier mobility change accompanying the isomerization reaction. Particularly, it is known that of the diheteroarylethenes as shown in FIG. 2, the ionization potential significantly changes along with the change of the molecular structure from the closed-ring state to the open-ring state. FIG. 3 illustrates such a state. In a case where the diheteroarylethenes are employed as the bistable molecules, the open-ring form and the closed-ring form corresponding to the isomers before and after storage are present stably for a long period of time. Accordingly, the obtained information storage device has a function as a non-volatile memory.

In the case of the photochromic diheteroarylethenes as shown in FIG. 2, the "relatively high voltage" to be applied for storage of information by the isomerization reaction is generally at a level of from 3 to 15 V, although it depends on the electric characteristics (such as carrier mobility and ionization potential) of the material and the device structure.

For regeneration (readout) of the stored information, by applying a voltage lower than that for information storage, holes are injected to the organic layer but no electrons are injected, due to the difference in the potential barrier between the anode 12 and the hole transport layer 15 and between the cathode 11 and the electron transport layer 14.

In a case where the bistable molecule-containing layer 13 is in the initial state (non-recorded state), the ionization potential of said layer is close to that of the hole transport layer 15, and the potential barrier is low, holes pass through the hole transport layer 15 and further the bistable molecule-containing layer 13 and the electron transport layer 14 and reaches the cathode 11, and as a result, an electric current flows, as shown in FIG. 4(a).

On the other hand, in a case where the bistable molecule-containing layer 13 is in the isomerized state (recorded state), the ionization potential of said layer is significantly different from that of the hole transport layer 15, and the potential barrier is high, holes are blocked by the potential barrier as shown in FIG. 4(b), whereby no electric current flows.

As mentioned above, regeneration of the stored information becomes possible by flowability of the electric current. In this case, injection of electrons to the bistable molecule-containing layer is inhibited, whereby the isomerization reaction of the molecules due to recombination of the holes and electrons is prevented, and accordingly so-called "realization of nondestructive readout" is simultaneously achieved, which has been problematic when the photochromic molecules are employed for optical memory.

In the case of the photochromic diheteroarylethenes as shown in FIG. 2, the relatively low voltage for regeneration of information is generally at a level of from 0.5 to 10 V, although it depends on the material or the structure of the device in the same manner as described above.

In a case where storage and regeneration of information is carried out by utilizing the difference in the ionization potential of the isomers of the bistable molecules as between before and after the storage, it is more preferred that the isomers a and b of the molecules before and after the information storage satisfy the formula:

[Ionization potential of the isomer a]>[Ionization potential of the isomer b]

and the ionization potential of the isomer a is higher by at least 0.1 eV than the ionization potential of a layer which performs a function of hole injection.

"The layer which performs a function of hole injection" means a layer which is in contact with the anode side interface of the bistable molecule-containing layer. For example, in the case of an information storage device wherein the anode/bistable molecule-containing layer/cathode are laminated in this order, the layer which performs a function of hole injection is the anode, and in the case of the layer constitution as shown in FIGS. 3, 4(a) and 4(b), it is the hole transport layer 15.

It is preferred that between the isomers corresponding to those before and after the storage of the bistable molecules, the isomer a which has a high ionization potential is in a state after the storage, and that the ionization potential of the isomer a is higher than the ionization potential of the layer which performs a role of hole injection, specifically by at least at a level of 0.1 eV as shown in FIG. 4, whereby the holes can securely be blocked, and their arrival at the cathode can be inhibited.

The information storage and regeneration method of the information storage device of the present invention has been explained employing an example wherein the change in the HOMO level accompanying the isomerization reaction of the bistable molecules is utilized with reference to FIGS. 3, 4(a) and 4(b), but the same applies to a case where the mobility of the holes and/or electrons changes by the isomerization.

Now, the present invention will be described in further detail with reference to Example. However, it should be understood that the present invention is by no means restricted to such specific Example.

EXAMPLE 1

An information storage device of the present invention having a circuit structure as shown in FIG. 1 was produced by employing photochromic diheteroarylethenes as shown in FIG. 2 as bistable molecules.

On a glass substrate, Pt (film thickness: 50 nm) was formed by vacuum deposition as an anode electrode, N,N'-di(naphthalene-1-yl)-N,N'-diphenyl-benzidine was formed thereon in a thickness of 30 nm as a hole transport layer, the diheteroarylethenes as shown in FIG. 2 was formed thereon in a thickness of 20 nm as a bistable molecule-containing layer, and aluminum tris(8-hydroxy-quinolinate) was formed thereon in a thickness of 20 nm as an electron transport layer, each by vacuum deposition. Further, $LiO_2$ (film thickness: 0.3 nm) as a cathode buffer layer and Ag (film thickness: 10 nm) as a cathode were laminated thereon, each by vacuum deposition, and a transparent electrically conductive film (ITO) as a protective electrode layer was formed thereon in a film thickness of 100 nm by sputtering. The film laminate at the cathode side thus formed has translucency to a certain extent.

The device was preliminarily irradiated with ultraviolet rays so that all the diheteroarylethenes in the bistable molecule-containing layer were in a closed-ring state by the photochromic isomerization reaction, and this state was taken as the initial state.

Then, a voltage of 4 V was applied to the device, whereupon it was confirmed that an electric current of 20 $\mu A$ flowed in the device. Even after a pulse at the same voltage (pulse width: 1 $\mu s$) was applied 10,000,000 times, the electric current value did not change.

Then, a voltage of 8 V was applied to the device, and the electric current value which flowed at the pulse voltage of 4 V was measured again, whereupon no electric current was confirmed this time. This is because both holes and electrons were injected to the diheteroarylethenes in the bistable molecule-containing layer by application of a high voltage of 8 V, and accordingly the compound was in the excited state and underwent the isomerization reaction and became in an open-ring state, as described above.

Even after a pulse voltage of 4 V was applied 10,000,000 times in this state, no change was confirmed.

Finally, it was confirmed that the device recovered to the initial state by irradiation with ultraviolet rays again.

As described above in detail, according to the present invention, by employing, as an information storage material, bistable molecules which undergo an isomerization reaction by electric carrier injection, and the electric characteristics of which change accompanying the isomerization reaction, a remarkably high integrated and non-volatile information storage device can be realized.

Accordingly, by the information storage and regeneration method of the present invention, storage of information, and further, regeneration of information can be carried out by employing the information storage device of the present invention.

The entire disclosure of Japanese Patent Application No. 2002-167375 filed on Jun. 7, 2002 including specification, claims, drawings and summary are incorporated herein by reference in its entirety.

What is claimed is:

1. An information storage device which has a layer containing such bistable molecules that the molecular structure reversibly changes due to an isomerization reaction, at least one reaction of the isomerization reaction is caused by electric carrier injection, and the electric characteristics change as between before and after the isomerization reaction.

2. The information storage device according to claim 1, which has an information storage part having the layer containing the bistable molecules, and a switch part controlling the voltage to be applied to the information storage part.

3. The information storage device according to claim 1, wherein the bistable molecules are photochromic diheteroarylethenes having an electron transport group and a hole transport group.

4. The information storage device according to claim 3, wherein the photochromic diheteroarylethenes are represented by the following formula (I):

formula (I)

(I)

(wherein each of $R^1$ and $R^2$ which are independent of each other, is a $C_{1-3}$ alkyl group or an alkoxy group, and each of rings D and E which are independent of each other, is (wherein R is $R^1$ or $R^2$, and R' is $R^3$ or $R^4$), $R^3$ is a diarylamino group which may have a substituent, and $R^4$ is an oxadiazole group substituted with a 4-mercaptobiphenyl group, provided that the 4-mercaptobiphenyl group may further have a substituent).

5. The information storage device according to claim 1, wherein the electric characteristics of the bistable molecules which reversibly change are ionization potential, and isomers a and b of the bistable molecules before and after the information storage satisfy the formula:

[ionization potential of the isomer a]>[ionization potential of the isomer b]

and the ionization potential of the isomer a is higher by at least 0.1 eV than the ionization potential of a layer which performs a function of hole injection.

6. The information storage device according to claim 1, wherein the layer containing the bistable molecules is present between an anode and a cathode directly or by means of an optional layer.

7. The information storage device according to claim 6, wherein a hole transport layer is present between the anode and the bistable molecule-containing layer, and an electron transport layer is present between the cathode and the bistable molecule-containing layer.

8. An information storage method of storing information on the information storage device as defined in claim 1, which comprises carrying out electric carrier injection on the layer containing the bistable molecules of the information storage device to cause an isomerization reaction on the bistable molecules.

9. An information regeneration method of reading out information from the information storage device as defined in claim 1, which comprises applying a voltage to the layer containing the bistable molecules of the information storage device, and detecting a change in the electric current as between before and after the storage.

10. An information storage and regeneration method employing the information storage device as defined in claim 1, which comprises carrying out electric carrier injection to the layer containing the bistable molecules of the information storage device to cause an isomerization reaction on the bistable molecules thereby to store information, and applying a voltage to the layer containing the bistable molecules of the information storage device and detecting a change in the electric current as between before and after the storage to read out information.

* * * * *